(12) United States Patent
Zhang et al.

(10) Patent No.: US 8,870,345 B2
(45) Date of Patent: Oct. 28, 2014

(54) METHOD OF MAKING SUPEROLEOPHOBIC RE-ENTRANT RESIST STRUCTURES

(75) Inventors: Yuanjia Zhang, Rochester, NY (US);
Kyoo-Chul Park, Cambridge, MA (US);
Hong Zhao, Webster, NY (US);
Kock-Yee Law, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 43 days.

(21) Appl. No.: 13/550,169

(22) Filed: Jul. 16, 2012

(65) Prior Publication Data
US 2014/0015900 A1  Jan. 16, 2014

(51) Int. Cl.
*B41J 29/393* (2006.01)

(52) U.S. Cl.
USPC ............................................................ 347/47

(58) Field of Classification Search
USPC ............................................................ 347/47
See application file for complete search history.

(56) References Cited

U.S. PATENT DOCUMENTS

| 2011/0157276 A1 | 6/2011 | Zhao et al. |
| 2011/0157277 A1 | 6/2011 | Zhao et al. |
| 2011/0157278 A1 | 6/2011 | Gulvin et al. |

*Primary Examiner* — Lamson Nguyen
(74) *Attorney, Agent, or Firm* — Pillsbury Winthrop Shaw Pittman LLP

(57) ABSTRACT

A device and method for preparing a device having a superoleophobic surface are disclosed. The method includes providing a substrate; coating a lift-off resist layer on the substrate; baking the lift-off resist layer; layering a photoresist layer on the lift-off resist layer; performing photolithography to create a textured pattern in the photoresist layer and the lift-off resist layer, and chemically modifying the textured pattern to create a superoleophobic surface.

18 Claims, 6 Drawing Sheets

METHOD OF MAKING SUPEROLEOPHOBIC RE-ENTRANT RESIST STRUCTURES

BACKGROUND

Disclosed herein is a process for preparing a device having a superoleophobic surface comprising providing a substrate; using photolithography to create a textured pattern on the substrate wherein the textured pattern comprises polymeric overhang structures; and chemically modifying the textured surface by disposing a fluorinated coating thereon; to provide a flexible device having a superoleophobic surface. The flexible, superoleophobic device can be used, for example, as a front face surface for an ink jet printhead.

Fluid ink jet systems typically include one or more printheads having a plurality of ink jets from which drops of fluid are ejected towards a recording medium. The ink jets of a printhead receive ink from an ink supply chamber or manifold in the printhead which, in turn, receives ink from a source, such as a melted ink reservoir or an ink cartridge. Each ink jet includes a channel having one end in fluid communication with the ink supply manifold. The other end of the ink channel has an orifice or nozzle for ejecting drops of ink. The nozzles of the ink jets may be formed in an aperture or nozzle plate that has openings corresponding to the nozzles of the ink jets. During operation, drop ejecting signals activate actuators in the ink jets to expel drops of fluid from the ink jet nozzles onto the recording medium. By selectively activating the actuators of the ink jets to eject drops as the recording medium and/or printhead assembly are moved relative to one another, the deposited drops can be precisely patterned to form particular text and graphic images on the recording medium.

One difficulty faced by fluid ink jet systems is wetting, drooling or flooding of inks onto the printhead front face. Such contamination of the printhead front face can cause or contribute to blocking of the ink jet nozzles and channels, which alone or in combination with the wetted, contaminated front face, can cause or contribute to non-firing or missing drops, undersized or otherwise wrong-sized drops, satellites, or misdirected drops on the recording medium and thus result in degraded print quality. Efforts to address these issues have relied upon printhead front face coatings. Current printhead front face coatings are typically sputtered polytetrafluoroethylene coatings. When the printhead is tilted, the UV gel ink at a temperature of about 75° C. (75° C. being a typical jetting temperature for UV gel ink) and the solid ink at a temperature of about 105° C. (105° C. being a typical jetting temperature for solid ink) do not readily slide on the printhead front face surface. Rather, these inks flow along the printhead front face and leave an ink film or residue on the printhead which can interfere with jetting. For this reason, the front faces of UV and solid ink printheads are prone to be contaminated by UV and solid inks. In some cases, the contaminated printhead can be refreshed or cleaned with a maintenance unit. However, such an approach introduces system complexity, hardware cost, and sometimes reliability issues.

There remains a need for materials and methods for preparing devices having superoleophobic characteristics. Further, while currently available coatings for ink jet printhead front faces are suitable for their intended purposes, a need remains for an improved printhead front face design that reduces or eliminates wetting, drooling, flooding, and/or contamination of UV or solid ink over the printhead front face. There further remains a need for an improved printhead front face design that is ink phobic, that is, oleophobic, and robust to withstand maintenance procedures such as wiping of the printhead front face. There further remains a need for an improved printhead front face design that is superoleophobic. There remains a further need to develop simple, cost-effective processes to create superoleophobic textures on large area flexible substrates.

SUMMARY

Disclosed herein is a method for preparing a device having a superoleophobic surface, the method comprising providing a substrate; coating a lift-off resist layer on the substrate; drying the lift-off resist layer; layering a photoresist layer on the lift-off resist layer; performing photolithography to create a textured pattern in the photoresist layer and the lift-off resist layer, and chemically modifying the textured pattern.

Further disclosed herein is a method for preparing a device having a superoleophobic surface, the method comprising providing a substrate; optionally coating a silicon layer on the substrate; coating a lift-off resist layer on the substrate; baking the lift-off resist layer; depositing a photoresist on the baked lift-off resist layer to create a layered structure; baking the photoresist layer; exposing the photoresist layer to UV radiation; optionally baking the exposed photoresist layer; developing the photoresist layer; developing the lift-off resist layer to create a textured pattern; optionally etching the textured pattern; and modifying a surface of the textured pattern to create a superoleophobic surface.

Also disclosed is a device comprising a substrate; a lift-off resist layer; a photoresist layer, wherein the lift-off resist layer and the photoresist layer comprise a textured pattern; and an oleophobic coating disposed on the textured pattern.

EMBODIMENTS

Figure 1:
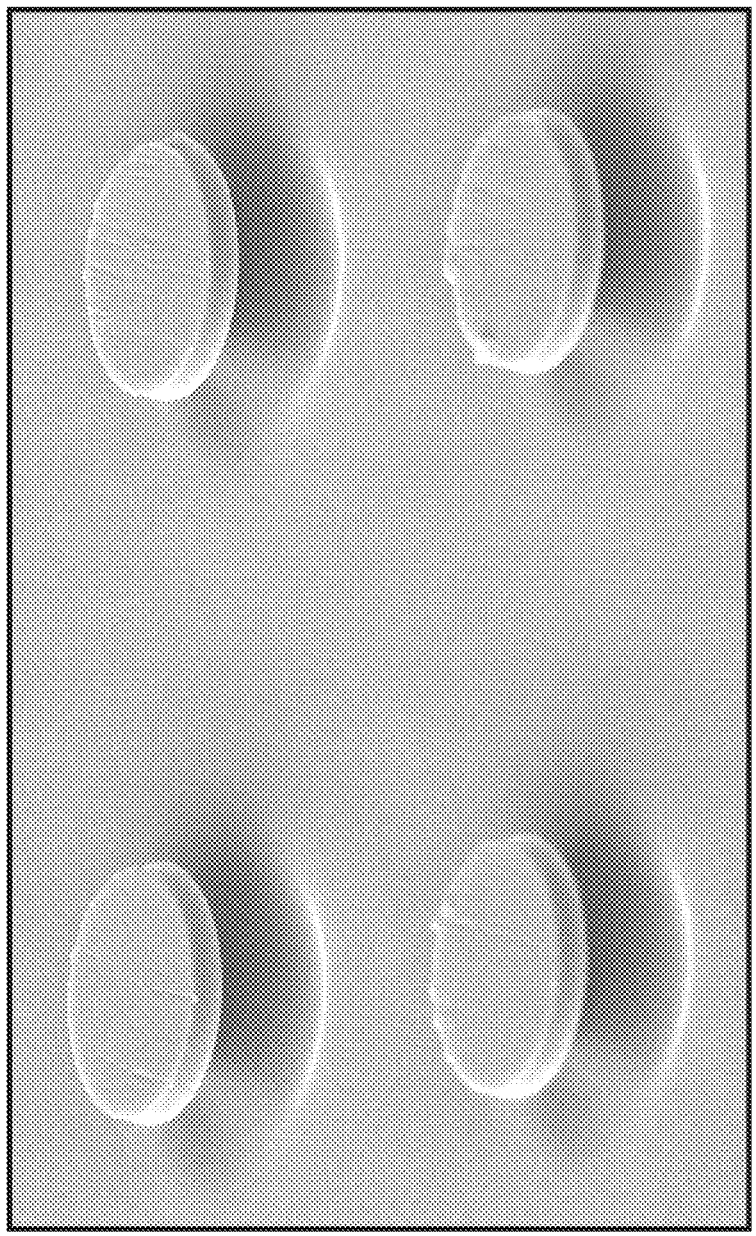
FIG. 1 is a scanning electron micrograph image of a textured pattern.

"Superoleophobic" as used herein refers, for example, to when a droplet of hydrocarbon-based liquid, for example, ink, forms a contact-angle with a surface that is greater than about 150°, such as from greater than about 150° to about 175°, or from greater than about 150° to about 160°. "Superoleophobic" also refers, for example, to when a droplet of a hydrocarbon-based liquid, for example, hexadecane, forms a sliding angle with a surface of from about 1° to less than about 30°, or from about 1° to less than about 25°, or a sliding angle of less than about 25°, or a sliding angle of less than about 15°, or a sliding angle of less than about 10°. Oleophobic coating as used herein can be described as the coating on which a droplet of hydrocarbon-based liquid, for example, hexadecane, forms a contact angle of larger than about 55°.

Disclosed herein is a method for preparing a device having a superoleophobic surface, the method comprising providing a substrate; coating a lift-off resist layer on the substrate; drying the lift-off resist layer; layering a photoresist layer on the lift-off resist layer; performing photolithography to create a textured pattern in the photoresist layer and the lift-off resist layer, and chemically modifying the textured pattern.

Any suitable material can be selected for the substrate described herein. For example, the substrate may be a silicon wafer. In addition, the substrate may be a flexible substrate. The flexible substrate may be plastic, and may be selected from among, for example, a polyimide film, a polyethylene naphthalate film, a polyethylene terephthalate film, a polyethersulfone film, or a polyetherimide film, and the like, or a combination thereof. In addition, the substrate may be metal, for example, stainless steel. The stainless steel may also be a flexible substrate. The substrate may be a glass substrate, and may also be flexible.

The substrate can be any suitable thickness. The substrate may have a thickness of from, for example, about 5 micrometers to about 100 micrometers, or from about 10 micrometers to about 50 micrometers.

A silicon layer may optionally be deposited onto the substrate by any suitable method. The silicon thin film may be deposited using, for example, sputtering or chemical vapor deposition, very high frequency plasma-enhanced chemical vapor deposition, microwave plasma-enhanced chemical vapor deposition, plasma-enhanced chemical vapor deposition, use of ultrasonic nozzles in an in-line process, and the like, among others. A silicon layer would not be necessary if the substrate is a silicon substrate.

The layer of silicon can be any suitable thickness. The silicon layer can be deposited onto the flexible substrate at a thickness of from, for example, about 500 to about 5,000 nanometers, from about 1,000 to about 4,000 nanometers, or from about 2,000 to about 3,000 nanometers.

A lift-off resist layer may be coated directly on the substrate or on the silicon layer. A lift-off resist layer refers, for example, to a resist material that may or may not be photosensitive. For example, the lift-off resist layer may be a layer based on polymethylglutarimide (PMGI) or poly(methyl methacrylate) (PMMA), or any other material that, when forming a bilayer structure with a photoresist, has a different solubility from the photoresist in selected solvents under certain process conditions.

The lift-off resist layer may be dissolved in any suitable solvent in order to coat the lift-off resist on the substrate or the silicon layer. Suitable solvents include, for example, cyclopentanone, isopropanol, or propylene glycol monomethyl ether acetate.

The lift-off resist layer may be coated onto the substrate or the silicon layer by any suitable method, for example by solution deposition. Solution deposition includes, for example, spin coating, dip coating, spray coating, slot die coating, flexographic printing, offset printing, screen printing, gravure printing, or inkjet printing.

After coating the lift-off resist layer on the substrate or the silicon layer, the lift-off layer is baked to evaporate the solvent from the lift-off resist layer. The lift-off resist layer may be baked at any temperature that allows for evaporation of the solvent and that does not alter the properties of the substrate or silicon layer or the substrate. For example, the lift-off resist may be baked at temperatures from about 140° C. to about 200° C., such as from about 150° C. to about 190° C., or from about 160° C. to about 185° C. The baking can occur for any length of time necessary for removal of the solvent. For example, the lift-off resist layer may be baked for 1 minute to about 30 minutes, from about 3 minutes to about 20 minutes, or from about 5 minutes to about 10 minutes. Examples of baking techniques may include thermal heating, for example, heating with a hot plate, an oven, or infra-red ("IR") radiation.

After baking the lift-off resist layer, a photoresist layer is deposited onto the baked lift-off resist layer. The photoresist layer may be a positive or negative photoresist. A positive photoresist refers, for example, to a type of photoresist in which a portion of the photoresist that is exposed to light, for example, ultraviolet (UV) light, becomes soluble to a photoresist developer. A portion of the photoresist that is unexposed to light remains insoluble to a photoresist developer. Examples of positive photoresists include, for example, OiR620-7i, Shipley 1800 Series, Rohm & Haas Megapsit SPR220 Series. In addition, in general, any positive photoresists based on photodefinable epoxies, photodefinable polyimides, and photodefinable PBO (polybenzobisoxazole) would function for the current purpose. Exemplary materials include positive-tone photoresists HD-8800 series available from HD MicroSystems of Parlin, N.J., or the like. A negative photoresist refers, for example, to a photoresist in which a portion of the photoresist that is exposed to light, for example UV light, becomes insoluble to a photoresist developer. The unexposed portion of the photoresist is dissolved by a photoresist developer. Examples of negative photoresist include, for example, photodefinable epoxies or negative-tone photosensitive polyimides, and related compounds known to the art. Exemplary materials include Microchem SU-8 resist. Another example is negative-tone photodefinable polyimide precursor HD-4100 series, available from HD MicroSystems of Parlin, N.J. Another example is photosenstive CYCLOTENE 4000 Series resin, available from Dow Chemical Company of Midland, Mich., and the like. Desirably, the photoresist is not the same as the material as the lift-off resist layer.

The photoresist may be dissolved in any suitable solvent, for coating the photoresist layer on the baked lift-off resist layer. For example, the photoresist may be dissolved in any of the solvents described above. However, it is preferred that the lift-off resist does not, or only partially, dissolves in the solvent used for the photoresist. For example, the photoresist and lift-off resist would be immiscible. The solvent for photoresist depends on the photoresist used, and the appropriate solvents to use are known in the art.

The photoresist layer may be deposited by any known method, for example, by solution deposition described above. After deposition, the photoresist layer is baked to evaporate the solvent. The photoresist layer may be baked at any temperature that allows for evaporation of the solvent and that does not alter the properties of the lift-off resist layer, the silicon layer, or the substrate. For example, the lift-off resist may be baked at temperatures from about 90° C. to about 120° C., such as from about 100° C. to about 115° C. The baking can occur for any length of time necessary for removal of the solvent. For example, the lift-off resist layer may be baked for 1 minute to about 5 minutes, such as from about 2 minutes to about 4 minutes. Examples of baking techniques are described above.

After baking, photolithography may be used to create a textured pattern in the photoresist layer and the lift-off resist layer. Photolithography involves exposing at least a portion of the photoresist layer or at least a portion of the photoresist layer and at least a portion of the lift-off resist layer to light, for example, UV light, then developing the exposed photoresist layer and lift-off resist layer or the exposed photoresist layer and the exposed lift-off resist layer. The exposing of the photoresist layer and the lift-off resist layer may occur simultaneously or in separate exposing steps. In addition, the developing of the photoresist layer and the lift-off resist layer may occur simultaneously or in separate development steps.

The exposure involves using a mask to selectively expose a portion of the photoresist layer and the lift-off resist layer to UV radiation, for example, to create a pattern in the photoresist layer and the lift-off resist layer. A mask is any suitable material that does not allow light, for example, UV light to penetrate the mask. The mask may be, for example, a glass substrate coated with a Cr layer with an etched pattern, or a polymer substrate coated with a darkened film with a pattern.

The photoresist layer may be exposed, for example, to UV radiation and the photoresist layer and the lift-off resist layer may be simultaneously developed, or the photoresist layer may be exposed to UV radiation, then the photoresist layer may be developed, followed by development of the lift-off resist layer. Alternatively, the photoresist layer may be exposed to UV radiation, and then following UV exposure of the photoresist layer, the photoresist layer may be developed. After development of the photoresist layer, the lift-off resist layer is exposed to UV radiation, and then following UV exposure of the lift-off resist layer, the lift-off resist layer is developed.

In addition, after exposure of the photoresist layer to UV radiation, but before the photoresist layer is developed, the exposed photoresist layer may optionally be baked. The type of photoresist selected determines if this optional step is needed, and would be known at the time of selection of the photoresist. For example, for a positive photoresist, this optional baking step may be used to create a smooth surface of the sidewall of photoresist layer. For a negative photoresist, this baking is usually necessary to drive to completion the reaction initiated by exposure described above. For example, the exposed photoresist may be baked at a temperature that is about the same as pre-exposure bake. The baking can occur for any length of time necessary to eliminate the sidewall roughness, sometimes referred to in the art as the "standing wave effect" of a positive photoresist or to complete the reaction of the negative photoresist. For example, the exposed photoresist layer may be baked for 1 minute to about 30 minutes, such as from about 3 minutes to about 20 minutes, or from about 5 minutes to about 10 minutes. Examples of baking techniques are described above.

As described above, after exposure of the photoresist layer or the photoresist layer and the lift-off resist layer to UV radiation, the photoresist layer and the lift-off resist layer are developed. Developing removes any portion of the photoresist layer and the lift-off resist layer that is soluble in the developer. The photoresist layer and the lift-off resist layer may be developed according to methods known in the art. For example, if a positive photoresist is used for the photoresist layer, after exposing a portion of the photoresist layer to UV radiation, the exposed portion becomes soluble in a first developing solution. The developing solution is applied to the photoresist layer to remove the solubilized portion of the photoresist layer. The type of developing solution used to remove the exposed portion of the photoresist layer depends on the particular photoresist used for the photoresist layer and this relationship is known in the art. For example, the developer may be an organic developer such as a sodium hydroxide containing developer or a metal-ion free developer such as tetramethylammonium hydroxide.

After removal of the solubilized portion of the exposed photoresist layer, a second developing solution may be applied to remove a portion of the lift-off resist layer. The lift-off resist layer is soluble in the second developer. The second developing solution may be the same as or different from the first developing solution. If the second developing solution is the same as the first developing solution, removal of the solubilized portion of the exposed photoresist layer and a portion of the lift-off resist layer may occur in the same step, meaning that a second application of the first developer may not be needed. It is known in the art that the length of time the lift-off resist layer is exposed to the developer determines how much of the lift-off resist layer is removed by the developer. For example, the lift-off resist layer may be exposed to the developer for about 15 seconds to about 2 minutes, such as for about 30 seconds to about 90 seconds, or from about 45 seconds to about 1 minute in order to create a re-entrant structure. Removal of the solubilized portion of the exposed photoresist layer and a portion of the lift-off resist layer may create a re-entrant structure.

However, it is known in the art that the baking temperature and the baking time will determine the dissolution rate of the lift-off resist layer in the developer. For example, a longer baking time and/or higher temperature results in drier and denser film and would decrease the dissolution rate. Thus, the lift-off resist layer may need to be developed for a longer or shorter time the more the dissolution rate is decreased or increased, respectively. The length of the exposure of the lift-off resist layer to the developing solution to create a re-entrant structure will vary based upon the baking time and temperature, and this variation is known in the art.

The textured pattern may be, for example, a re-entrant structure. A re-entrant structure refers, for example, to a structure that has at least one internal angle that is greater than 180°. In addition, the re-entrant structure may be an overhang re-entrant structure. The re-entrant structure may be, for example, an individual re-entrant structure or a continuous grooved structure.

Figure 2:
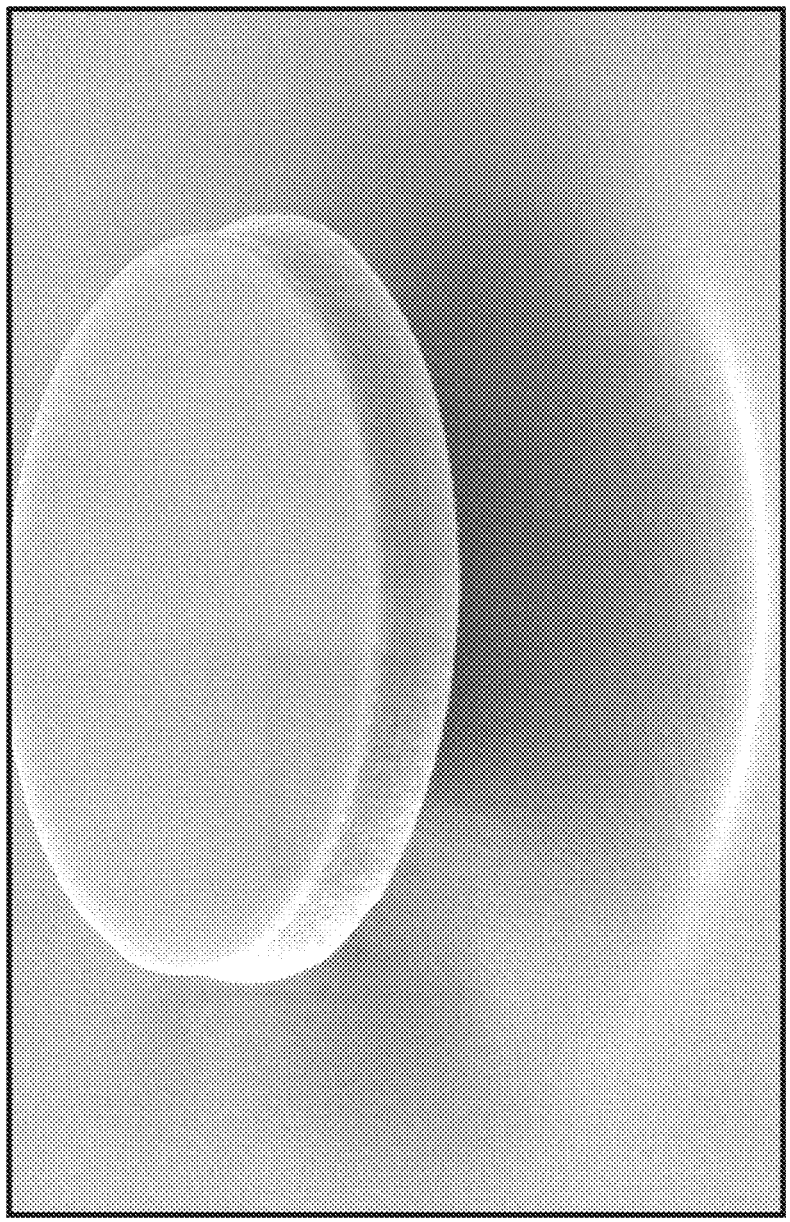
FIG. 2 is a scanning electron micrograph image of a single overhang re-entrant structure.
Figure 3:
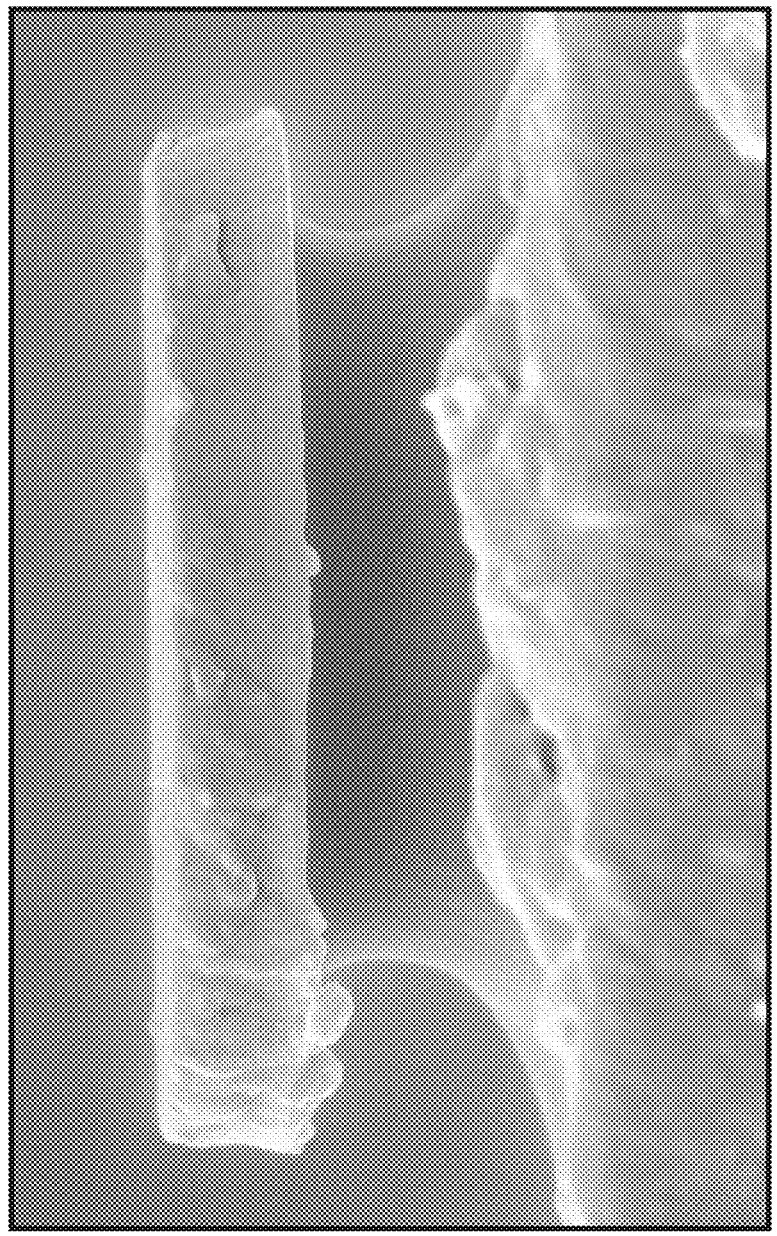
FIG. 3 is a scanning electron micrograph image of a side view of a single overhang re-entrant structure.

Individual re-entrant structures are depicted in FIGS. 1 and 2. In an individual re-entrant structure, the entirety of the developed photoresist layer extends further in a direction parallel with the substrate than the textured lift-off resist layer, such that the photoresist material overhangs the underlying lift-off resist layer material. The individual re-entrant structures may have any suitable spacing, density or solid area coverage on the substrate. For example, the individual re-entrant structures may have a solid area coverage of from about 0.5% to about 80%, or from about 1% to about 50% of the substrate. The individual re-entrant structures may be spaced, for example, 0.5 µm to about 10 µm, from about 1 µm to about 8 µm, or from about 2 µm to about 5 µm apart when measure from the centers of the individual re-entrant structures.

Figure 4:
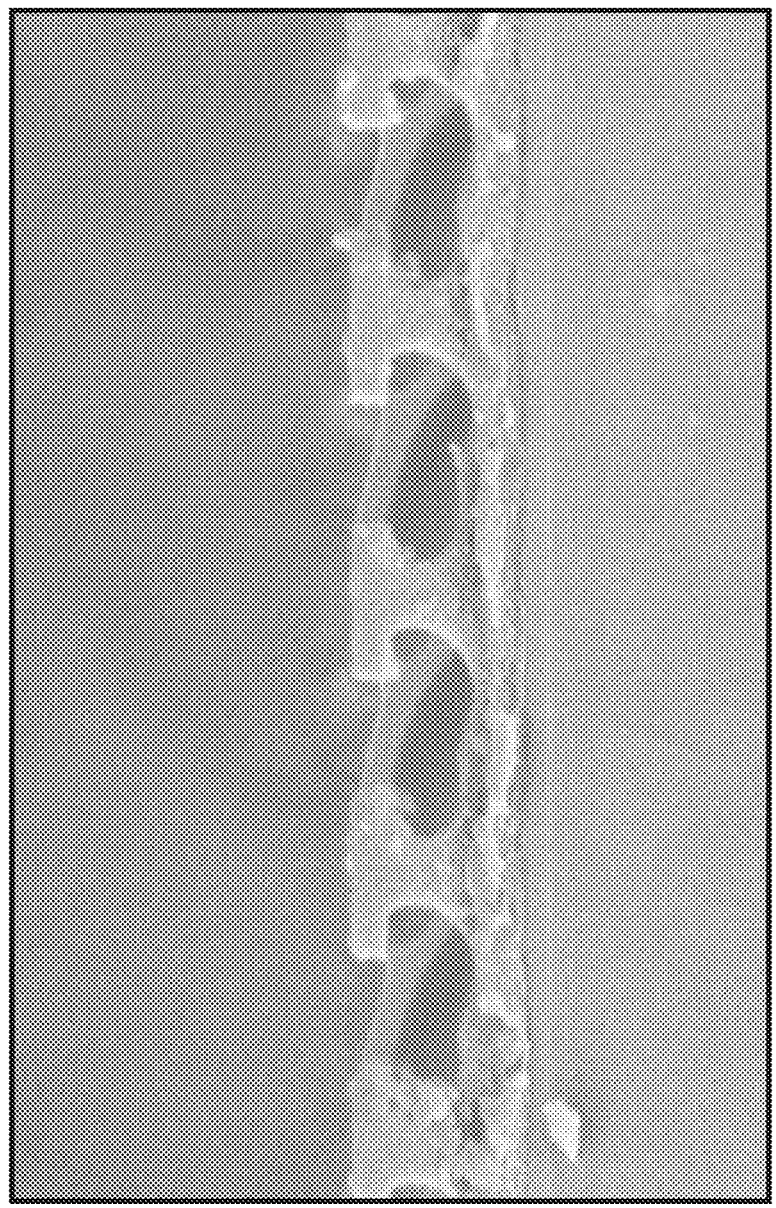
FIG. 4 is a scanning electron micrograph image of a side view of a textured pattern.

A continuous re-entrant grooved structure is depicted in FIG. 4. The grooved structure may act as a channel for a drop, for example, an ink drop, to flow through. A continuous re-entrant groove structure may extend from one edge of the substrate to the opposite edge of the substrate. In a continuous re-entrant structure, at least a portion of the developed photoresist layer extends further in a direction parallel with the substrate than the developed lift-off resist layer. The continuous re-entrant structures may have any suitable spacing, density or solid area coverage on the substrate. For example, the continuous re-entrant structures may have a solid area coverage of from about 1% to about 80%, from about 1% to about 50%, or from about 2% to about 30% of the substrate. The continuous re-entrant structures may be spaced, for example, from about 0.5 µm to about 10 µm, such as from about 1 µm to about 8 µm, or from about 2 µm to about 6 µm, apart when measured from the centers of the re-entrant structures. The continuous groove structure can have any suitable length. For example, the groove structure may have a length of at least about 3 times of the width, such as at least about 4 times of the width, or at least about 5 times of the width.

In addition, for either an individual re-entrant structure or a continuous re-entrant structure, after development, the length of an undercut may be, for example, about 0.1 microns to about 5 microns, such as from about 0.5 microns to about 4 microns, or from about 1 micron to about 3 microns. The undercut results in at least a portion of the photoresist layer extending beyond at least a portion of the lift-off resist layer.

The individual re-entrant structures or the continuous re-entrant groove structure may have any suitable or desired height. Height, refers, for example, to a direction that is perpendicular to the substrate, but does not pass through the substrate. For example, the re-entrant structures may have a height of from about 0.1 to about 10 microns, such as from about 0.2 to about 5 microns, or from about 0.5 to about 3 microns.

In addition, after development of the lift-off resist layer, the lift-off resist layer of the individual re-entrant structures or the continuous re-entrant groove structure may have any suitable thickness. Thickness refers, for example, to at least one direction that is parallel to the substrate. The thickness of the lift-off resist layer, after development, may be from about 0.1 microns to about 10 microns, such as from about 0.2 microns to about 5 microns, or from about 0.5 microns to about 3 microns.

Etching may also be used to further refine the geometry of the re-entrant structure. For example, the photoresist layer of the formed re-entrant structure may be etched to reduce the height of the overall structure. Alternatively, the substrate or the silicon layer may be etched in order to increase the height of the overall structure.

Etching may occur by any known process. For example, etchants include a hydrofluoric acid etching solution or a plasma gas etch, such as an oxygen plasma etch. During the etching process, for example, for an oxygen plasma etchant, the oxygen plasma reacts with the polymeric photoresist and forms volatile compounds such as $CO_2$ or $H_2O$, thus reducing the photoresist height.

After the surface texture is created on the substrate or the silicon layer, the textured pattern may be chemically modified. Chemically modifying the textured pattern refers, for example, to any suitable chemical treatment of the substrate that provides or enhances the oleophobic quality of the textured pattern. Chemically modifying the textured pattern creates a superoleophobic surface on the textured pattern. Chemically modifying the textured substrate may include chemical modification by a conformal self-assembling fluorosilane coating onto the textured surface. The term "conformal" refers, for example, to a coating designed to conform to the surface of an article or structures being coated. For example, a conformal oleophobic coating may be formed conforming to the textured surface depicted in FIG. 1 or 4, for example, by conforming to each exposed surface of the textured surface including all of the exposed surfaces of the patterned layers and all of exposed surfaces of the substrate. The conformal oleophobic coating may have a thickness substantially uniform on these exposed surfaces.

Any known method may be used to dispose the chemical modifier onto the surface of the textured pattern. For example, the chemical modifier may be disposed onto the surface of the textured pattern via a molecular vapor deposition technique, a chemical vapor deposition technique, E-beam, sputtering technique, for example, a vapor-phase silanization technique, or a solution self-assembly technique.

For example, the chemically modifying may comprise disposing a chemical modifier, for example, a fluorosilane layer, onto the surface of the textured pattern. The fluorosilane layer may be, for example synthesized from, tridecafluoro-1,1,2,2-tetrahydrooctyltrichlorosilane, tridecafluoro-1,1,2,2-tetrahydrooctyltrimethoxysilane, tridecafluoro-1,1,2,2-tetrahydrooctyltriethoxysilane, heptadecafluoro-1,1,2,2-tetrahydrodecyltrichlorosilane, heptadecafluoro-1,1,2,2-tetrahydrodecyltrimethoxysilane, heptadecafluoro-1,1,2,2-tetrahydrodecyltriethoxysilane, fluorodecyltrichlorosilane (FDTS), and the like, or combinations thereof.

Chemically modifying the textured substrate may also include solution coating a conformal amorphous fluoropolymer onto the textured surface. For example, the amorphous fluoropolymer may be a copolymer that is copolymerized from tetrafluoroethylene (TFE) and 2,2-bis-trifluoromethyl-4,5-difluoro-1,3-dioxole (BDD) monomers. The molar ratio of TFE:BDD in the amorphous fluoropolymer coating can be between 5:95 and 50:50, or between 10:90 and 45:55, or between 15:85 and 36:64. Examples of the conformal amorphous fluoropolymer coating include DuPont Teflon AF1600 and AF2400 or a perfluoropolyether polymer such as Fluorolink-D, Fluorolink-E10H or the like from Solvay Solexis.

Two states are commonly used to describe the composite liquid-solid interface between liquid droplets on chemically modified textured pattern, the Cassie-Baxter state and the Wenzel state. Static contact angles for a droplet at the Cassie-Baxter state ($\theta_{CB}$) and the Wenzel state ($\theta_W$) are given by equations (1) and (2), respectively.

$$\cos\theta_{CB} = R_f f \cos\theta_\gamma + f - 1 \quad (1)$$

$$\cos\theta_W = r \cos\theta_\gamma \quad (2)$$

where f is the area fraction of projected wet area, $R_f$ is the roughness ratio on the wet area and $R_f f$ is solid area fraction, r is the roughness ratio, and $\theta_\gamma$ is the contact angle of the liquid droplet with a flat surface.

In the Cassie-Baxter state, the liquid droplet "sits" primarily on air and partially on solid asperities with a very large contact angle ($\theta_{CB}$). According to the equation, liquid droplets will be in the Cassie-Baxter state if the liquid and the surface have a high degree of liquid repellency, for example, when $\theta_\gamma \geq 90°$.

With respect to hydrocarbon-based liquid, for example, an ink, for example, hexadecane, the textured pattern comprising overhang re-entrant structures formed on the top surface of the structure renders the surface "liquid repellent" enough (that is, $\theta_\gamma = 73°$) to result in the hexadecane droplet forming the Cassie-Baxter state at the liquid-solid interface of the textured, oleophobic surface. However, as the oleophobicity of the surface coating decreases, the textured surface actually transitions from the Cassie-Baxter state to the Wenzel state. The combination of surface texture and chemical modification, for example, FDTS coating on the surface of the textured pattern, results in the textured surface becoming superoleophobic.

Figure 9:
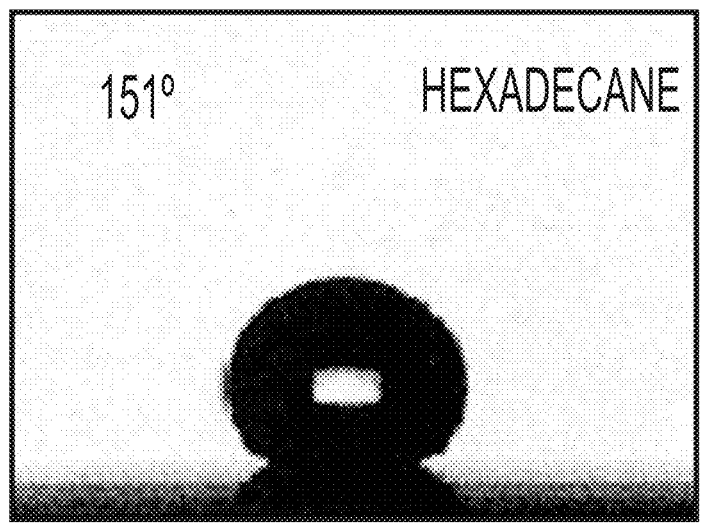
FIG. 9 is a photograph showing the static contact angle for hexadecane on a fluorosilane-coated textured surface comprising overhang structures.

FIG. 9 depicts a static contact angle for hexadecane on a fluorosilane-coated textured surface comprising overhang re-entrant structures. The contact angle for the hexadecane is 151°. This illustrates the liquid is in the Cassie-Baxter non-wetting state on the textured surface. While not wishing to be bound by theory, it is believed that the re-entrant structure in combination with the fluorosilane coating imparts the superoleophobicity property.

The device having superoleophobic surfaces herein may be prepared, for example, using roll-to-roll web fabrication technology. This process generally comprises creating a flexible device having a superoleophobic surface on a roll comprising a flexible substrate, for example, polyimide. Roll-to-roll processing has the advantage of being a continuous process as the substrate advances from the first station to subsequent, downstream stations. For example, a roll comprising a flexible substrate passes through a first station wherein a layer of amorphous silicon may be deposited on the flexible substrate, such as by chemical vapor deposition or sputtering. As described above, deposition of a silicon layer is not a necessary step of the process, and this station may be omitted. At a second station downstream from the optional first station, a lift-off resist layer is coated on the substrate or, if present, on the silicon layer. For example, the lift-off resist layer may be slot die coated, after which, at a third station, a photoresist layer is coated onto the lift-off resist layer, followed by a fourth station comprising a masking and exposing/developing station to create a textured pattern. The textured, flexible substrate may then pass through a coating station wherein the textured, flexible substrate can be modified with an oleophobic coating.

The superoleophobic surfaces described herein may be particularly suitable for use as front face materials for ink jet printheads.

As described above, fluid ink jet systems typically include one or more printheads having a plurality of ink jets from which drops of fluid are ejected towards a recording medium. By selectively activating the actuators of the ink jets to eject drops as the recording medium and/or printhead assembly are moved relative to one another, the deposited drops can be precisely patterned to form particular text and graphic images on the recording medium. MEMSJet drop ejectors consist of an air chamber under an ink chamber, with a flexible membrane in-between. Voltage is applied to an electrode inside the air chamber, attracting the grounded flexible membrane downward, increasing the volume of the ink chamber and thus lowering its pressure. This causes ink to flow into the ink chamber from the ink reservoir. The electrode is then grounded and the membrane's restoring force propels it upward, creating a pressure spike in the ink cavity that ejects a drop from the nozzle. An example of a full width array printhead is described in U.S. Pat. No. 8,132,892, which is hereby incorporated by reference herein in its entirety. An example of an ultra-violet curable gel ink which can be jetted in such a printhead is described in U.S. Pat. No. 7,714,040, which is hereby incorporated by reference herein in its entirety. An example of a solid ink which can be jetted in such a printhead is the Xerox Color Qube™ cyan solid ink available from Xerox Corporation. U.S. Pat. No. 5,867,189, which is hereby incorporated by reference herein in its entirety, describes an ink jet print head including an ink ejecting component which incorporates an electropolished ink-contacting or orifice surface on the outlet side of the printhead.

EXAMPLES

The purpose of the following examples is to illustrate re-entrant structures made from a lift-off resist layer and a photoresist layer.

Example 1

The process disclosed herein was used to make the overhang re-entrant structures depicted in FIG. 1. A lift-off resist layer of PMGI spin-coated on to a silicon wafer. The lift-off resist layer was baked on a hotplate for five minutes at 180° C. A photoresist layer 102 (Shipley 1805) was spin-coated over the baked lift-off resist layer. The layered structure was baked for 45 seconds at 115° C. After baking, a portion of the layered structure was then exposed to UV radiation at 436 nm wavelength using a 5× stepper, for example, a GCA 6300 DSW Projection Mask Aligner, and then developed for 45 seconds in a tetra-methyl ammonium hydroxide based developer, for example, AZ 300 MIF Photoresist Developer from AZ Electronic Materials. A rinse in deionized water immediately after development was performed. In the above-described process, the lift-off resist layer was not influenced by the UV radiation exposure and the development of the photoresist layer. The development of the lift-off layer creates an undercut structure, thus creating an overhang re-entrant structure. The photoresist layer extends beyond the lift-off resist layer in a direction parallel to the substrate.

After creation of the overhang re-entrant structure, the surface of the overhang structure was chemically modified with fluorodecyltrichlorosilane (FDTS). FDTS was disposed on the surface of the textured pattern by vapor-phase salinization, although preferably the fluoropolymer is disposed on the surface of the textured pattern by dip coating. The dip coating can be carried out in a fluoropolymer solution, which can be a mixture of DuPont TEFLON AF1600 and FC-75 fluorinated solvent from 3M, at a volume ratio of about 1:5. Following the dipping, the film can be air-dried for several minutes and then dried in oven at about 112° C.

Example 2

Figure 5:
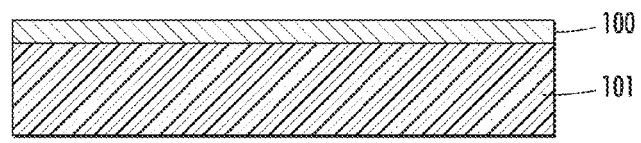
FIGS. 5-8 illustrate a process for creating a textured pattern.
Figure 6:
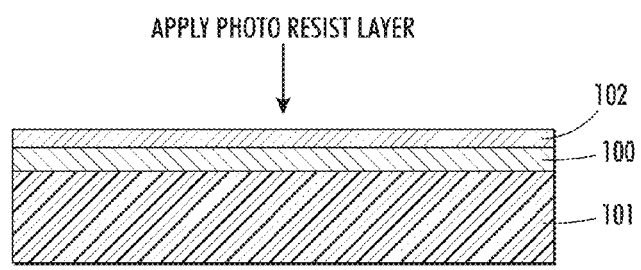
Figure 7:
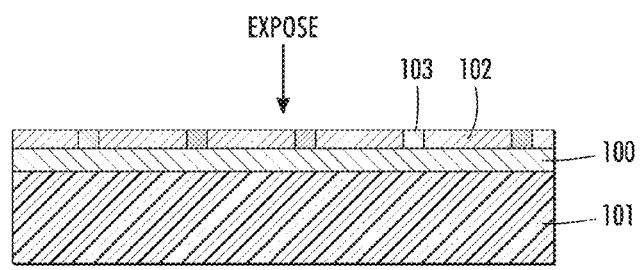

FIG. 5 graphically depicts a lift-off resist layer 100 of PMGI (LOR 7B by MicroChem) spin-coated onto a silicon wafer 101. The lift-off resist layer 100 was baked on a hotplate for five minutes at 180° C. FIG. 6 shows a photoresist layer 102 (SU-8 2000.5) was spin-coated over the baked lift-off resist layer. In FIG. 7, the layered structure was baked for 60 seconds at 95° C. After baking, a portion 103 of the layered structure was then exposed to UV radiation at 436 nm wavelength using a 5× stepper, for example, a GCA 6300 DSW Projection Mask Aligner, and baked again for 60 seconds at 95° C.

Figure 8:
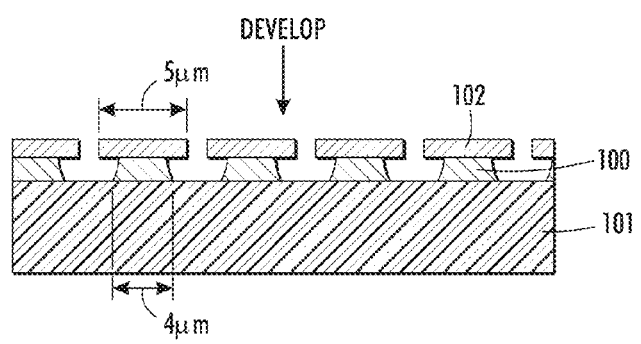

FIG. 8 depicts the result of a two-step development. The exposed photoresist layer was first developed for 60 seconds in solvent-based developer such as ethyl lactate or diacetone alcohol, for example, SU-8 developer from MicroChem. A rinse in isopropanol after development is preferred. In the above-described process, the lift-off resist layer was not influenced by the UV radiation exposure and the development of the photoresist layer. The lift-off resist layer was subsequently developed for 10 seconds in a tetra-methyl ammonium hydroxide based developer, for example, AZ 300 MIF Photoresist Developer from AZ Electronic Materials, to create an undercut. The creation of the undercut results in an overhang re-entrant structure. A rinse in deionized water after development is preferred. As illustrated in FIG. 8, the photoresist layer extended about 5 µm in a direction parallel to the substrate and the lift-off resist layer extended approximately 4 µm in a direction parallel to the substrate.

The chemical modification was performed of the surface of the overhang structure was performed as described in Example 1.

The textured patterned structures herein, for example, individual re-entrant structures, can have any suitable shapes and patterns. The overall textured structure can have or form a configuration designed to form a specific pattern. For example, in embodiments, the individual re-entrant structure or continuous groove structure can be formed to have a configuration selected to direct a flow of liquid in a selected flow pattern.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method comprising:
providing a substrate;
coating a lift-off resist layer on the substrate
baking the lift-off resist layer;
depositing a photoresist on the baked lift-off resist layer to create a layered structure;
baking the photoresist layer;
exposing the photoresist layer to UV radiation;
optionally baking the exposed photoresist layer;
developing the photoresist layer;
developing the lift-off resist layer to create a textured pattern;
optionally etching the textured pattern; and
modifying a surface of the textured pattern to create a superoleophobic surface.

2. The method of claim 1, wherein the modifying includes disposing at least one chemical modifier selected from the group consisting of tridecafluoro-1,1,2,2-tetrahydrooctyltrichlorosilane, tridecafluoro-1,1,2,2-tetrahydrooctyltrimethoxysilane, tridecafluoro-1,1,2,2-tetrahydrooctyltriethoxysilane, heptadecafluoro-1,1,2,2-tetrahydrooctyltrichlorosilane, heptadecafluoro-1,1,2,2-tetrahydrooctyltrimethoxysilane, and heptadecafluoro-1,1,2,2-tetrahydrooctyltriethoxysilane, an oleophobic fluoropolymer and a perfluoropolyether polymer copolymerized from tetrafluoroethylene and 2,2-bis-trifluoromethyl-4,5-difluoro-1,3-dioxole, or combinations thereof, on the surface of the textured pattern.

3. The method of claim 1, wherein the textured pattern has a solid area coverage of about 0.5% to about 80% of the substrate.

4. The method of claim 1 wherein the texture pattern comprises overhang re-entrant structures, wherein the overhang re-entrant structures have height of about 0.1 microns to about 10 microns and a thickness of about 0.1 microns to about 10 microns.

5. The method of claim 1, wherein the textured pattern is an overhang re-entrant structure with an undercut of about 0.1 microns to about 5 microns.

6. The method of claim 1, wherein at least a portion of the developed photoresist layer extends further in a direction parallel to the substrate than at least a portion of the developed lift-off resist layer.

7. The method of claim 1, wherein the lift-off resist layer is a polymethylglutarimide or poly(methyl methacrylate).

8. The method of claim 1, wherein the method comprises roll-to-roll fabrication technology to prepare a flexible device having a superoleophobic surface.

9. A method for preparing a flexible device having a superoleophobic surface, the method comprising:
providing a flexible substrate;
coating a lift-off resist layer on the flexible substrate;
drying the lift-off resist layer;
layering a photoresist layer on the lift-off resist layer;
performing photolithography to create a textured pattern from the photoresist layer and the lift-off resist layer, and
chemically modifying the textured pattern.

10. The method of claim 9, wherein the performing photolithography comprises:
exposing the photoresist layer to UV radiation; and
simultaneously developing the photoresist layer and the lift-off resist layer.

11. The method of claim 9, wherein the lift-off resist layer is a polymethylglutarimide layer.

12. The method of claim 9, wherein the performing photolithography comprises:
exposing the photoresist layer to UV radiation;
developing the photoresist layer; and
developing the lift-off resist layer.

13. The method of claim 12, wherein the lift-off resist layer is a polymethylglutarimide layer.

14. The method of claim 9, wherein the performing photolithography comprises:
exposing the photoresist layer to UV radiation;
developing the photoresist layer;
exposing the lift-off resist layer to UV radiation; and
developing the lift-off resist layer.

15. The method of claim 14, wherein the lift-off resist layer is poly(methyl methacrylate).

16. The method of claim 9, wherein the chemically modifying includes disposing at least one chemical modifier selected from the group consisting of tridecafluoro-1,1,2,2-tetrahydrooctyltrichlorosilane, tridecafluoro-1,1,2,2-tetrahydrooctyltrimethoxysilane, tridecafluoro-1,1,2,2-tetrahydrooctyltriethoxysilane, heptadecafluoro-1,1,2,2-tetrahydrooctyltrichlorosilane, heptadecafluoro-1,1,2,2-tetrahydrooctyltrimethoxysilane, and heptadecafluoro-1,1,2,2-tetrahydrooctyltriethoxysilane an oleophobic fluoropolymer and a perfluoropolyether polymer copolymerized from tetrafluoroethylene and 2,2-bis-trifluoromethyl-4,5-difluoro-1,3-dioxole, or combinations thereof, on the surface of the textured pattern.

17. The method of claim 9, wherein the preparation comprises roll-to-roll fabrication technology to prepare the flexible device having a superoleophobic surface.

18. The method of claim 9, wherein the textured pattern is an overhang re-entrant structure.

* * * * *